(12) United States Patent
Youn et al.

(10) Patent No.: US 11,302,762 B2
(45) Date of Patent: Apr. 12, 2022

(54) DISPLAY DEVICE WITH REDUCED DEAD SPACE

(71) Applicant: Samsung Display Co., Ltd., Yongin-Si (KR)

(72) Inventors: Il Goo Youn, Asan-si (KR); Ji-Eun Lee, Seoul (KR); Jun Young Jo, Hwaseong-si (KR); Min Hee Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/952,489

(22) Filed: Nov. 19, 2020

(65) Prior Publication Data

US 2021/0159298 A1 May 27, 2021

(30) Foreign Application Priority Data

Nov. 21, 2019 (KR) .................. 10-2019-0150352

(51) Int. Cl.
*G09G 3/32* (2016.01)
*H01L 27/32* (2006.01)
*G09G 3/3258* (2016.01)
*G09G 3/3275* (2016.01)
*G09G 3/3266* (2016.01)

(52) U.S. Cl.
CPC ....... *H01L 27/3272* (2013.01); *G09G 3/3258* (2013.01); *H01L 27/3265* (2013.01); *H01L 27/3276* (2013.01); *G09G 3/3266* (2013.01); *G09G 3/3275* (2013.01); *G09G 2300/0439* (2013.01); *G09G 2310/0232* (2013.01); *G09G 2310/0281* (2013.01)

(58) Field of Classification Search
CPC ............ H01L 27/3272; H01L 27/3265; H01L 27/3276; G09G 3/32; G09G 3/3258; G09G 2300/0439; G09G 2310/0232; G09G 2310/0281
See application file for complete search history.

(56) References Cited

U.S. PATENT DOCUMENTS

| | | | | |
|---|---|---|---|---|
| 2006/0043877 | A1* | 3/2006 | Inoue | H01J 29/90 313/496 |
| 2014/0176886 | A1* | 6/2014 | Yoshida | G02F 1/134309 349/110 |
| 2016/0064413 | A1* | 3/2016 | Cai | H01L 27/124 257/774 |
| 2018/0006272 | A1* | 1/2018 | Lee | H01L 27/3272 |
| 2019/0131371 | A1* | 5/2019 | Yi | H01L 51/5284 |

(Continued)

FOREIGN PATENT DOCUMENTS

| | | |
|---|---|---|
| JP | 2016200659 A | 12/2016 |
| KR | 1020200032302 A | 3/2020 |
| KR | 1020200066504 A | 6/2020 |

*Primary Examiner* — Pegeman Karimi
(74) *Attorney, Agent, or Firm* — Cantor Colburn LLP

(57) ABSTRACT

A display device includes a pixel structure disposed in a display area, a first signal line disposed in a peripheral area adjacent to the display area, a second signal line which overlaps the first signal line in a plan view and extends in the same direction as the first signal line, a driving circuit part disposed in the peripheral area and electrically connected to the first signal line and the second signal line, and a first shielding pattern disposed between the first signal line and the second signal line.

20 Claims, 8 Drawing Sheets

(56) References Cited

U.S. PATENT DOCUMENTS

2019/0197965 A1\* 6/2019 Park ................... G09G 3/3266
2021/0020734 A1\* 1/2021 Yokoyama .......... H01L 27/3276
2021/0141479 A1\* 5/2021 Lee .................... G06F 3/04164

\* cited by examiner

DISPLAY DEVICE WITH REDUCED DEAD SPACE

This application claims priority to Korean Patent Application No. 10-2019-0150352, filed on Nov. 21, 2019, and all the benefits accruing therefrom under 35 U.S.C. § 119, the content of which in its entirety is herein incorporated by reference.

BACKGROUND

1. Technical Field

Example embodiments relate generally to a display device. More particularly, example embodiments relate to the display device with reduced a dead space.

2. Description of the Related Art

Generally, as a display device includes display elements that emit light by being provided voltages or signals, the display device may display a predetermined image. To provide the voltages or the signals to the display elements, lines may be disposed in a peripheral area of the display device.

Generally, no image is displayed in the peripheral area where the lines are disposed. The peripheral area in which the image is not displayed is called the 'dead space'. Since an increase of the dead space decreases an immersion of a user to the displayed image and increases a size of the display device, it is desirable to reduce the dead space.

SUMMARY

To prevent a coupling effect between lines which transfer the voltages or the signals, the lines, disposed in the peripheral area, should be disposed at regular intervals from each other. Accordingly, there is a limit to reducing the dead space. Some example embodiments provide a display device with a reduced dead space.

According to an aspect of example embodiments, a display device includes a pixel structure disposed in a display area, a first signal line disposed in a peripheral area adjacent to the display area, a second signal line which overlaps the first signal line in a plan view and extends in the same direction as the first signal line, a driving circuit part disposed in the peripheral area and electrically connected to the first signal line and the second signal line, and a first shielding pattern disposed between the first signal line and the second signal line.

In example embodiments, a constant voltage may be provided to the first shielding pattern.

In example embodiments, the constant voltage may be a high power voltage.

In example embodiments, the constant voltage may be an initialization voltage.

In example embodiments, a width of the first shielding pattern may be greater than a width of the first signal line, and may be greater than a width of the second signal line.

In example embodiments, the display device may further include a first signal transmission line disposed between the first shielding pattern and the first signal line. The first signal transmission line may electrically connect the first signal line to the driving circuit part.

In example embodiments, the display device may further include a second signal transmission line disposed on the second signal line. The second signal transmission line may electrically connect the second signal line to the driving circuit part.

In example embodiments, the pixel structure may include a first active pattern, a first gate electrode disposed on the first active pattern, a capacitor electrode pattern disposed on the first gate electrode, a second active pattern disposed on the capacitor electrode pattern, a second gate electrode disposed on the second active pattern, a data line pattern disposed on the a second gate electrode, and a connecting electrode disposed on the data line pattern. The first shielding pattern may be disposed in the same layer as the second gate electrode. The first signal line may be disposed in the same layer as the first gate electrode. The second signal line may be disposed in the same layer as the data line pattern.

In example embodiments, the first signal transmission line may be disposed in the same layer as the capacitor electrode pattern, and the second signal transmission line may be disposed in the same layer as the connecting electrode.

In example embodiments, the first and second signal transmission lines may be disposed in the same layer as the capacitor electrode pattern.

In example embodiments, the second signal line may include an extension part overlapping the second signal transmission line in the plan view, the extension part may be connected to the second signal transmission line through a contact part, and the contact part may be spaced apart from the first shielding pattern.

In example embodiments, the first active pattern may include a silicon semiconductor, and the second active pattern may include an oxide semiconductor.

In example embodiments, the display device may further include a third signal line disposed in the peripheral area and a fourth signal line which overlaps the third signal line and extends in the same direction as the third signal line. The first shielding pattern may be further disposed between the third signal line and the fourth signal line, and the driving circuit part may be electrically connected to the first to fourth signal lines.

In example embodiments, the first shielding pattern may include a first assistance shielding pattern and a second assistance shielding pattern, the first assistance shielding pattern may be disposed between the first signal line and the second signal line, the second assistance shielding pattern may be disposed between the third signal line and the fourth signal line, and the first and second assistance shielding patterns may be spaced apart from each other.

In example embodiments, the display device may further include a plurality of data lines disposed in the display area, a first transmission line disposed in the peripheral area and electrically connected to a first data line of the plurality of data lines, a second transmission line which overlaps the first transmission line in the plan view and is electrically connected to a second data line of the plurality of data lines, and a second shielding pattern disposed between the first transmission line and the second transmission line. A constant voltage may be provided to the second shielding pattern.

According to another aspect of example embodiments, a display device includes a pixel structure disposed in a display area, a plurality of data lines disposed in the display area, a first transmission line disposed in a peripheral area adjacent to the display area and electrically connected to a first data line of the plurality of data lines, a second transmission line which overlaps the first transmission line in a plan view and is electrically connected to a second data line of the plurality of data lines, and a shielding pattern disposed between the first transmission line and the second transmission line. A constant voltage is provided to the shielding pattern.

In example embodiments, the constant voltage may be a high power voltage.

In example embodiments, the constant voltage may be an initialization voltage.

In example embodiments, the pixel structure may include a first active pattern, a first gate electrode disposed on the first active pattern, a capacitor electrode pattern disposed on the first gate electrode, a second active pattern disposed on the capacitor electrode pattern, a second gate electrode disposed on the second active pattern, a data line pattern disposed on the second gate electrode, and a connecting electrode disposed on the data line pattern. The shielding pattern may be disposed in a same layer as the second gate electrode, the first transmission line may be disposed in a same layer as the first gate electrode, and the second transmission line may be disposed in a same layer as the data line pattern.

In example embodiments, the display device may further include a third transmission line disposed in the peripheral area and electrically connected to a third data line of the plurality of data lines and a fourth transmission line which overlaps the third transmission line and is electrically connected to a fourth data line of the plurality of data lines. The shielding pattern may be further disposed between the third transmission line and the fourth transmission line.

Therefore, the display device according to example embodiments may include a first signal line and a second signal line which are disposed in a peripheral area. As the first signal line and the second signal line overlap each other, a width of the peripheral area may be reduced, or a space, in which an additional line may be disposed in the peripheral area, may be further secured.

In addition, since the display device includes a shielding pattern disposed between the first and second signal lines, an occurrence of a coupling effect between the first and second signal lines may be effectively prevented. Furthermore, as a constant voltage is provided to the shielding pattern, the display device may more effectively prevent the occurrence of the coupling effect.

BRIEF DESCRIPTION OF THE DRAWINGS

Illustrative, non-limiting example embodiments will be more clearly understood from the following detailed description in conjunction with the accompanying drawings.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Hereinafter, embodiments of the present inventive concept will be explained in detail with reference to the accompanying drawings.

Figure 1:
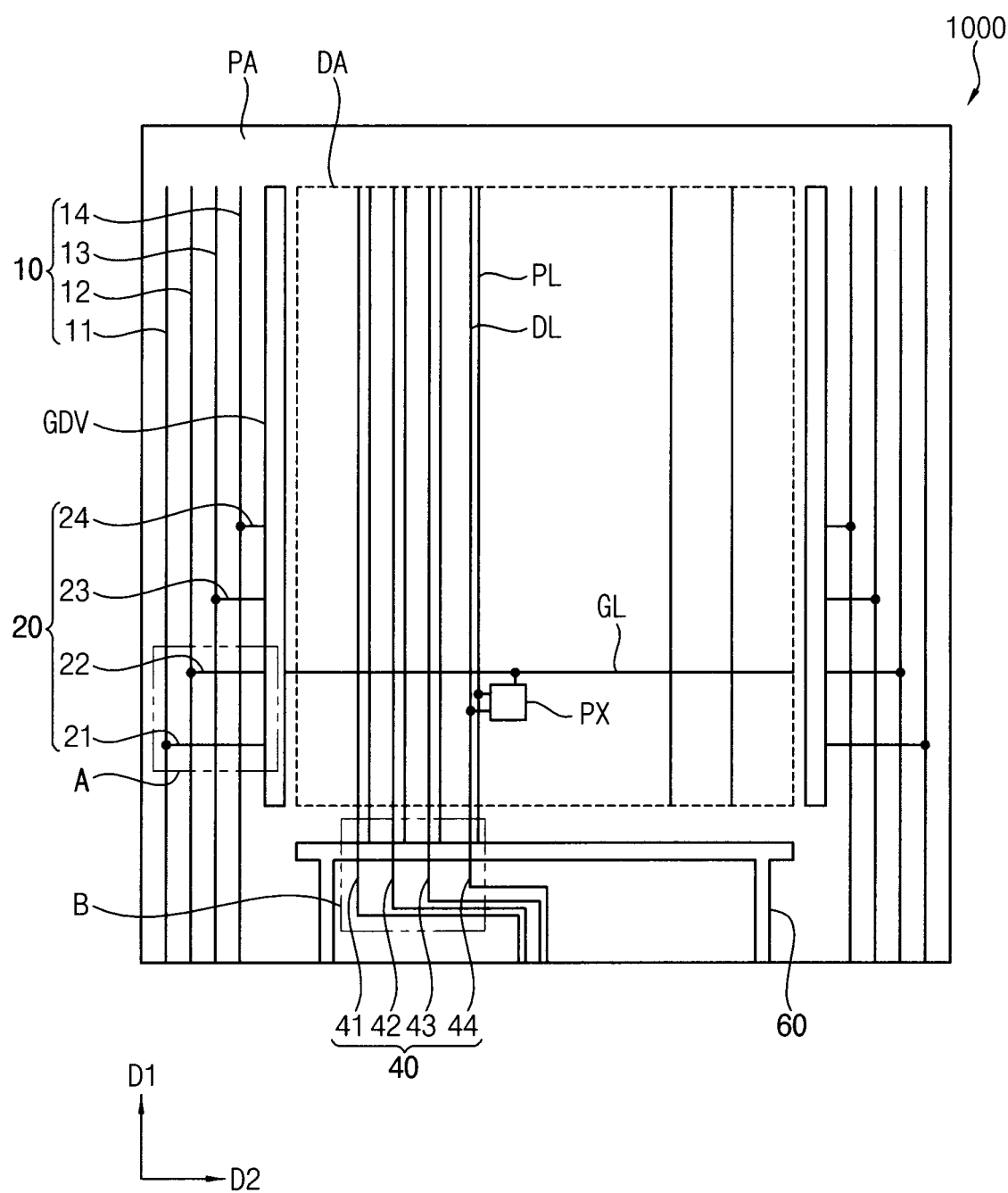
FIG. 1 is a schematic plan view illustrating a display device according to example embodiments.

FIG. 1 is a schematic plan view illustrating a display device according to example embodiments.

Referring to FIG. 1, the display device 1000 may include a display area DA and a peripheral area PA adjacent to the display area DA (e.g., surrounding the display area DA).

A pixel structure PX and lines for providing a voltage or a signal to the pixel structure PX may be disposed in the display area DA. For example, the lines may include a gate line GL, a data line DL, a driving voltage line PL, an initialization voltage line, and so on.

The data line DL may extend along a first direction D1, and may provide a data voltage to the pixel structure PX. The driving voltage line PL may extend along the first direction D1 in parallel with the data line DL, and may provide a high power voltage to the pixel structure PX. For example, the high power voltage may have a positive voltage level. The gate line GL may extend along a second direction D2 intersecting the first direction D1, and may provide a gate signal (or, a scan signal) to the pixel structure PX. The initialization voltage line may extend along the second direction D2 in parallel with the gate line GL, and may provide an initialization voltage to the pixel structure PX. The initialization voltage may be provided to the pixel structure PX through a gate electrode (e.g., a first gate electrode GE1 in FIG. 2). Accordingly, the gate electrode may be initialized with the initialization voltage. For example, the initialization voltage may have a negative voltage level.

The pixel structure PX may be disposed at each intersection of the data line DL and the gate line GL. The pixel structure PX may include a display element and a driving element for driving the display element. In an example embodiment, the display element may include an organic light emitting diode, and the driving element may include two or more transistors. As the data voltage, the high power voltage, the gate signal, the initialization voltage, and so on are provided to the driving element, the pixel structure PX may emit light.

The gate line GL and the data line DL may be disposed on different layers. For example, the gate line GL and the initialization voltage line may be disposed in a first layer, and may extend along the second direction D2. The data line DL and the driving voltage line PL may be disposed in a second layer positioned on the first layer, and may extend along the first direction D1.

A pad, a driving circuit part, a power line, a signal line 10, a signal transmission line 20, and a transmission line 40 may be disposed in the peripheral area PA.

For example, the pad may be disposed on a lower portion of the display device 1000 in a plan view, and may transfer the voltage or the signal, which is provided by an external device, to the display device 1000.

In an example embodiment, for example, the driving circuit part may include a gate driver GDV for generating the gate signal and a data driver for generating the data voltage.

In an example embodiment, the gate driver GDV may be disposed on a left portion and/or a right portion of the display device 1000 in a plan view. The gate driver GDV may include circuit elements such as transistors and capacitors to generate the gate signal and output the gate signal to the gate line GL.

In an example embodiment, the data driver may be disposed on an outside of the display device 1000, and may be electrically connected to the display device 1000 through the pad. The data driver may generate the data voltage. In another example embodiment, the data driver may be mounted inside the display device 1000 (for example, on a top and bottom portion of the display device 1000 in a plan view).

For example, the power line may include a high power voltage line 60 for providing the high power voltage to the pixel structure PX and a low power voltage line for providing a low power voltage to the pixel structure PX. Accordingly, the high power voltage may be provided to the pixel structure PX through the high power voltage line 60 and driving voltage line PL. The low power voltage may be provided to the pixel structure PX through the low power voltage line and a common electrode (e.g., a second electrode 230 in FIG. 2).

In an example embodiment, the signal line 10 may include first to fourth signal lines 11, 12, 13 and 14. The first to fourth signal lines 11, 12, 13 and 14 may be disposed on a left portion and/or a right portion of the display device 1000, and may extend along the first direction D1.

In an example embodiment, the first to fourth signal lines 11, 12, 13 and 14 may be electrically connected to the gate driver GDV through the signal transmission lines 21, 22, 23 and 24, respectively, such that the first to fourth signal lines 11, 12, 13 and 14 provide clock signals to the gate driver GDV. For example, the gate driver GDV may be disposed between the display area DA and the first to fourth signal lines 11, 12, 13 and 14.

The signal lines 10 according to example embodiments are not limited thereto. In another example embodiment, for example, the signal lines 10 may include five or more signal lines, or the third and fourth signal lines 13 and 14 may be omitted as necessary.

In an example embodiment, the transmission lines 40 may include first to fourth transmission lines 41, 42, 43 and 44. The first to fourth transmission lines 41, 42, 43 and 44 may be disposed on a lower portion of the display device 1000 in a plan view, and may extend along the first direction D1 and the second direction D2.

In an example embodiment, the first to fourth transmission lines 41, 42, 43 and 44 may be electrically connected to the data driver such that the first to fourth transmission lines 41, 42, 43 and 44 provide the data voltage to the data line DL.

However, the transmission lines 40 according to example embodiments are not limited thereto. In another example embodiment, for example, the transmission lines 40 may include five or more transmission lines, and may extend along a diagonal direction intersecting the first and second directions D1 and D2.

Figure 2:
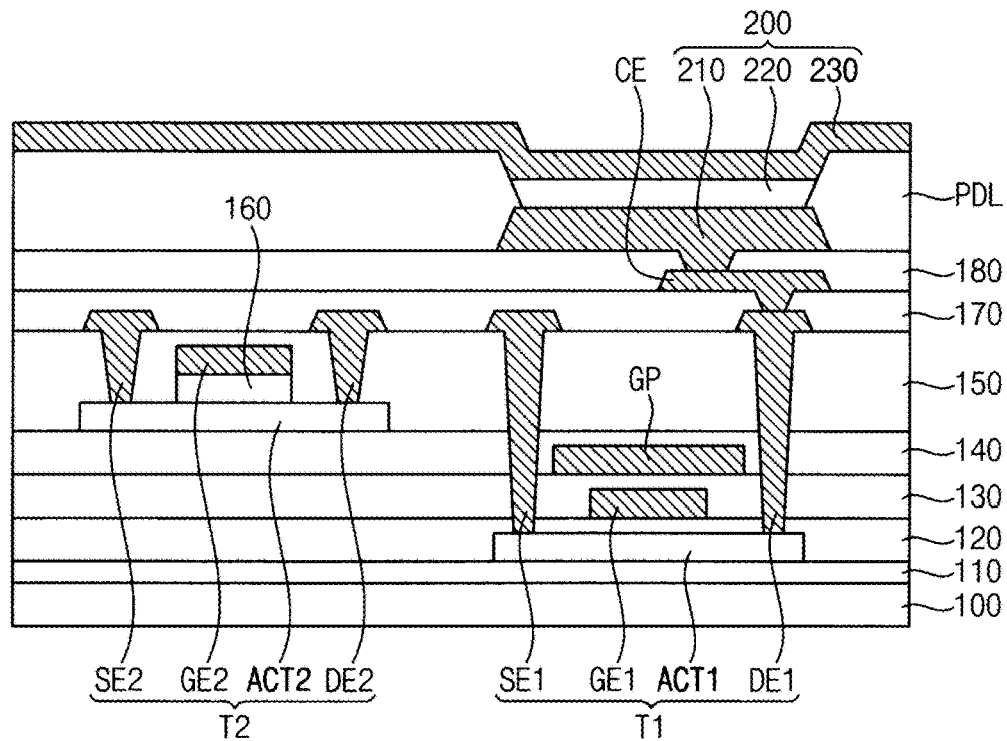
FIG. 2 is a cross-sectional view illustrating an example embodiment of a pixel structure disposed in a display area.

FIG. 2 is a cross-sectional view illustrating an example embodiment of a pixel structure disposed in a display area.

Referring to FIGS. 1 and 2, the pixel structure PX disposed in the display area DA may include a plurality of transistors disposed on a substrate 100, at least one storage capacitor, and an organic light emitting diode 200 electrically connected to the transistors.

The substrate 100 may include a glass substrate, a quartz substrate, a plastic substrate, and so on. In an example embodiment, the substrate 100 may include a polyimide-based plastic substrate such that the display device 1000 has a flexible characteristic. In an example embodiment, the substrate 100 may have a structure in which at least one polyimide layer and at least one barrier layer are alternately stacked.

In an example embodiment, a buffer layer 110 may be further disposed on the substrate 100. The buffer layer 110 may prevent metal atoms or impurities from being diffused into a first active pattern ACT1 from the substrate 100. In addition, the buffer layer 110 may adjust a heat transfer rate during a crystallization process for forming the first active pattern ACT1 to uniformly form the first active pattern ACT1.

The first active pattern ACT1 may be disposed on the buffer layer 110. In an example embodiment, the first active pattern ACT1 may include a silicon semiconductor such as an amorphous silicon, a polycrystalline silicon in which the amorphous silicon is crystallized, and the like. In addition, the first active pattern ACT1 may include a source region, a drain region, and a channel region positioned between the source and drain regions for constituting a first transistor T1 together with a first gate electrode GE1.

A first insulating layer 120 may cover the first active pattern ACT1. The first insulating layer 120 may include an insulating material. For example, the first insulating layer 120 may include silicon oxide, silicon nitride, titanium oxide, tantalum oxide, and the like.

The first gate electrode GE1 may be disposed on the first insulating layer 120, and may constitute the first transistor T1 together with the first active pattern ACT1. The first gate electrode GE1 may include a metal, an alloy, a conductive metal oxide, and the like. For example, the first gate electrode GE1 may include gold (Au), silver (Ag), copper (Cu), nickel (Ni), chromium (Cr), tungsten (W), molybdenum (Mo), titanium (Ti), and tantalum (Ta) or alloys thereof, and may have a single-layer structure or a multi-layer structure including different metal layers.

A second insulating layer 130 may cover the first gate electrode GE1. The second insulating layer 130 may include an insulating material. For example, the second insulating layer 130 may include silicon oxide, silicon nitride, titanium oxide, tantalum oxide, and the like.

A gate line pattern may be disposed on the second insulating layer 130. The gate line pattern may include a capacitor electrode pattern GP, the initialization voltage line, and so on. In an example embodiment, the capacitor electrode pattern GP may overlap the first gate electrode GE1. In an example embodiment, the capacitor electrode pattern GP may constitute the storage capacitor together with the first gate electrode GE1.

A third insulating layer 140 may cover the capacitor electrode pattern GP. The third insulating layer 140 may include an insulating material. For example, the third insulating layer 140 may include silicon oxide, silicon nitride, titanium oxide, tantalum oxide, and the like.

A second active pattern ACT2 may be disposed on the third insulating layer 140. In an example embodiment, the second active pattern ACT2 may include an oxide semiconductor. For example, the second active pattern ACT2 may include indium tin oxide ("ITO"), indium zinc oxide ("IZO"), indium zinc tin oxide ("IZTO"), indium gallium zinc oxide ("IGZO"), and the like. In addition, the second active pattern ACT2 may include a source region, a drain region, and a channel region positioned between the source and drain regions for constituting a second transistor T2 together with a second gate electrode GE2.

A gate insulating pattern 160 may cover the channel region of the second active pattern ACT2. The gate insulating pattern 160 may include an insulating material. For example, the gate insulating pattern 160 may include silicon oxide, silicon nitride, titanium oxide, tantalum oxide, and the like. In an example embodiment, the gate insulating pattern 160 may be patterned together with a second gate electrode GE2 such that the gate insulating pattern 160 has a shape substantially the same as the second gate electrode GE2 in a plan view.

The second gate electrode GE2 may be disposed on the gate insulating pattern 160 such that the second gate electrode GE2 constitutes the second transistor T2 together with the second active pattern ACT2. The second gate electrode GE2 may include a metal, an alloy, a conductive metal oxide, and the like. For example, the second gate electrode GE2 may include gold (Au), silver (Ag), copper (Cu), nickel (Ni), chromium (Cr), tungsten (W), molybdenum (Mo), titanium (Ti), and tantalum (Ta) or alloys thereof, and may have a single-layer structure or a multi-layer structure including different metal layers.

A fourth insulating layer 150 may cover the second gate electrode GE2. The fourth insulating layer 150 may include an insulating material. For example, the fourth insulating layer 150 may include silicon oxide, silicon nitride, titanium oxide, tantalum oxide, and the like.

A data line pattern may be disposed on the fourth insulating layer 150. The data line pattern may include the data line DL, the driving voltage line PL, a first source electrode SE1, a first drain electrode DE1, a second source electrode SE2, a second drain electrode DE2, and so on. The first source and drain electrodes SE1 and DE1 may contact the source and drain regions of the first active pattern ACT1, respectively. The second source and drain electrodes SE2 and DE2 may contact the source and drain regions of the second active pattern ACT2, respectively.

The data line pattern may include a metal, an alloy, a conductive metal oxide, and the like. For example, the data line pattern may include gold (Au), silver (Ag), copper (Cu), nickel (Ni), chromium (Cr), tungsten (W), molybdenum (Mo), titanium (Ti), and tantalum (Ta) or alloys thereof, and may have a single-layer structure or a multi-layer structure including different metal layers.

In an example embodiment, the first transistor T1 may be a driving transistor that provides a current to the organic light emitting diode 200, and the second transistor T2 may be a switching transistor that controls the driving transistor. In an example embodiment, the second gate electrode GE2 may be connected to the gate line GL such that the gate signal is provided to the second gate electrode GE2. In addition, the second source electrode SE2 may be connected to the data line DL such that the data voltage is provided to the second source electrode SE2.

A first-via-insulating layer 170 may cover the data line pattern, and may have a substantially flat top surface. A connecting electrode CE may be disposed on the first-via-insulating layer 170, and may contact the first drain electrode DE1. A second-via-insulating layer 180 may cover the connecting electrode CE, and may have a substantially flat top surface. The first and second-via-insulating layers 170 and 180 may include insulating materials. For example, the first and second-via-insulating layers 170 and 180 may include phenolic resin, polyimide resin, polyamide resin, epoxy resin, and the like.

A first electrode 210 may be disposed on the second-via-insulating layer 180. The first electrode 210 may be a transmissive electrode or a reflective electrode. For example, the first electrode 210 may include indium tin oxide (ITO), indium zinc oxide (IZO), gold (Au), silver (Ag), Aluminum (Al), chromium (Cr), tungsten (W), molybdenum (Mo), titanium (Ti), and the like. Meanwhile, the first electrode 210 may be an anode electrode of the organic light emitting diode 200.

A pixel defining layer PDL may be disposed on the second-via-insulating layer 180. The pixel defining layer PDL may define an opening exposing at least a portion of the first electrode 210. For example, the pixel defining layer PDL may include an organic insulating material.

An emission layer 220 may be disposed in the opening on the first electrode 210. The emission layer 220 may emit light having a red color, a green color, or the blue color. For example, the emission layer 220 may include a hole injection layer, a hole transport layer, an organic emission layer, an electron transport layer, an electron injection layer, and the like.

A second electrode 230 may be disposed on the entire emission layer 220 and the entire pixel defining layer PDL. In other words, the second electrode 230 may be continuously disposed over a plurality of the pixel structures disposed in the display area DA. The second electrode 230 may be a transmissive electrode or a reflective electrode. In an example embodiment, the second electrode 230 may be a cathode electrode of the organic light emitting diode 200.

In an example embodiment, a thin film encapsulation layer (not shown) may be further disposed on the second electrode 230. The thin film encapsulation layer may prevent a penetration of moisture and air from the outside. For example, the thin film encapsulation layer may include an inorganic layer and an organic layer which are alternately stacked.

However, a structure of the pixel structure PX is not limited to described-above. In another example embodiment, for example, the second active pattern ACT2 may be disposed in the same layer as the first active pattern ACT1, and the second gate electrode GE2 may be disposed in the same layer as the first gate electrode GE1. In addition, the connecting electrode CE and the second-via-insulating layer 180 may be selectively omitted.

Figure 3:
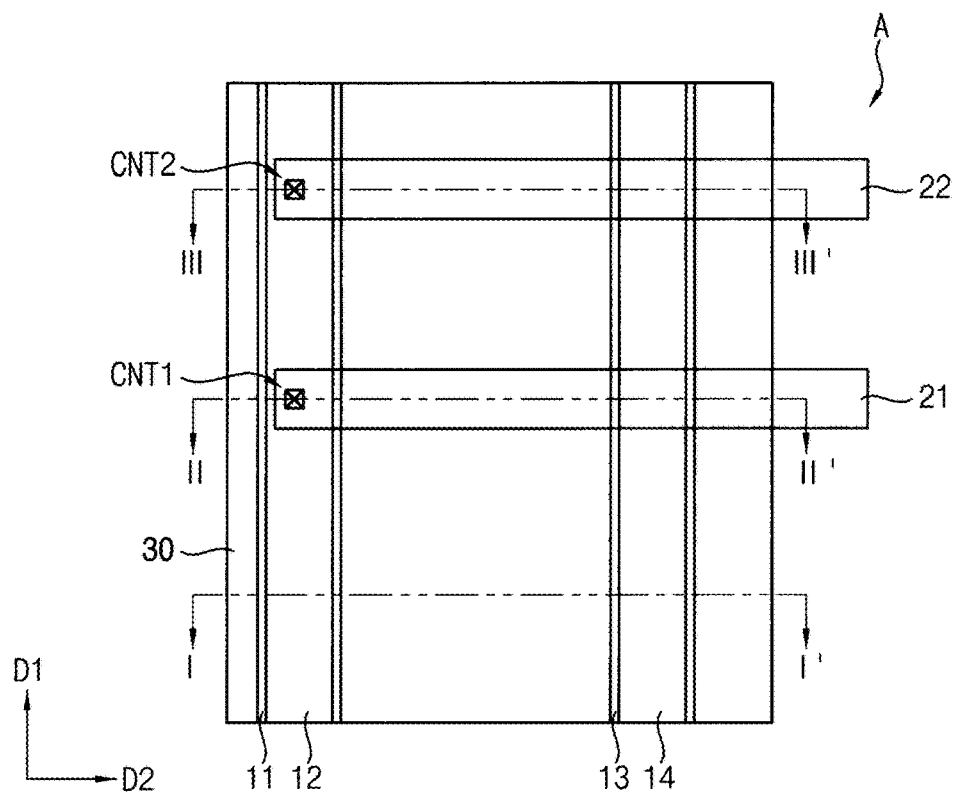
FIG. 3 is an enlarged plan view of area A of FIG. 1 according to an example embodiment.
Figure 4:
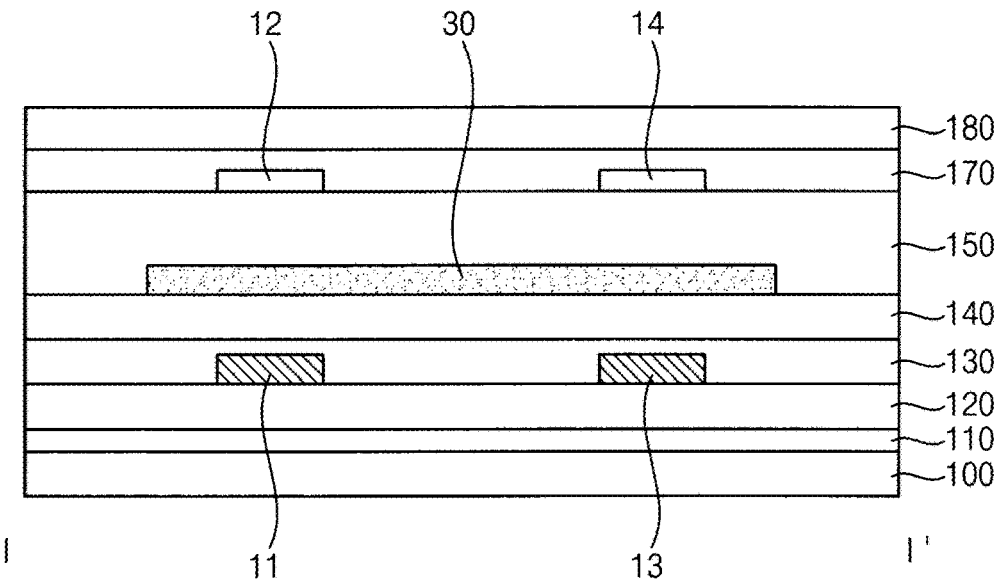
FIG. 4 is a cross-sectional view taken along line I-I' of FIG. 3.
Figure 5:
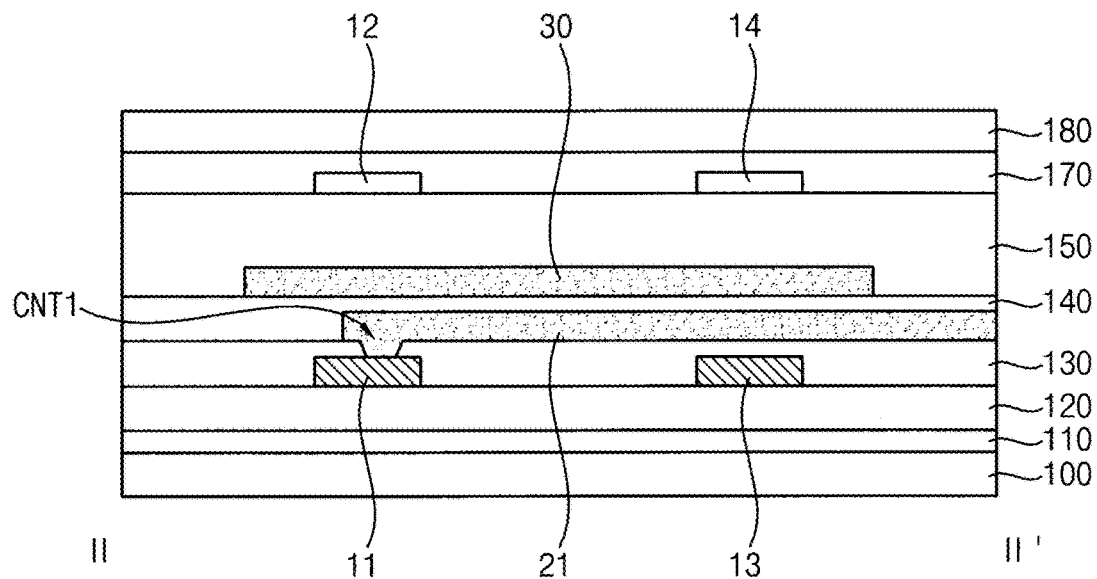
FIG. 5 is a cross-sectional view taken along line II-II' of FIG. 3.
Figure 6:
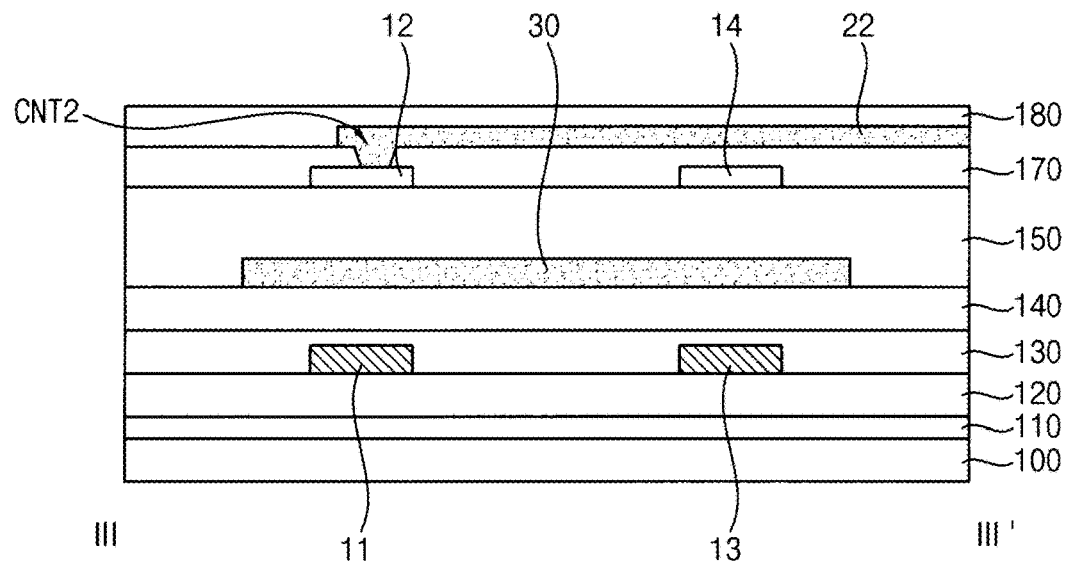
FIG. 6 is a cross-sectional view taken along line III-III' of FIG. 3.

FIG. 3 is an enlarged plan view of area A of FIG. 1 according to an example embodiment. FIG. 4 is a cross-sectional view taken along line I-I' of FIG. 3. FIG. 5 is a cross-sectional view taken along line II-II' of FIG. 3. FIG. 6 is a cross-sectional view taken along line III-III' of FIG. 3.

Referring to FIGS. 1, 2, 3, and 4, the first signal line 11 may be disposed in the peripheral area PA. The second signal line 12 may overlap the first signal line 11 in a plan view and may extend in the same direction (e.g., the first direction D1) as the first signal line 11.

In an example embodiment, the first signal line 11 may be disposed on the first insulating layer 120. Accordingly, the first signal line 11 may be disposed in the same layer as the first gate electrode GE1. In addition, the second signal line 12 may be disposed on the fourth insulating layer 150. Accordingly, the second signal line 12 may be disposed in the same layer as the data line pattern.

The first and second signal lines 11 and 12 may overlap each other in a plan view. As the first and second signal lines 11 and 12 overlap each other, a width of the peripheral area PA (e.g. a width along the second direction D2) may be reduced, or a space, in which an additional line may be disposed in the peripheral area PA, may be further secured.

A first shielding pattern 30 may be disposed between the first and second signal lines 11 and 12. In an example embodiment, the first shielding pattern 30 may overlap the first and second signal lines 11 and 12. Accordingly, the first shielding pattern 30 may extend along the same direction (e.g., the first direction D1) as the first and second signal lines 11 and 12. In addition, a width of the first shielding pattern 30 along the second direction D2 may be greater than a width of the first signal line 11, and may be greater than a width of the second signal line 12.

As the first and second signal lines 11 and 12, which transfer respective signals, overlap each other, a coupling effect may occur between the first and second signal lines 11 and 12. However, since the first shielding pattern 30 is disposed between the first and second signal lines 11 and 12, the occurrence of the coupling effect may be prevented.

In example embodiments, to more effectively prevent the occurrence of the coupling effect, a constant voltage may be provided to the first shielding pattern 30. In an example embodiment, the constant voltage may be the high power voltage. As described above, the high power voltage may have the positive voltage level. In an example embodiment, to provide the high power voltage to the first shielding pattern 30, the first shielding pattern 30 may be connected to the high power voltage line 60. In another example embodiment, the constant voltage may be the initialization voltage provided from the initialization voltage line. As described above, the initialization voltage may have the negative voltage level. However, the source of the constant voltage is not limited thereto. In another example embodiment, for example, an individual constant voltage other than the high power and the initialization voltage above may be provided to the first shielding pattern 30.

In an example embodiment, the first shielding pattern 30 may be disposed on the third insulating layer 140. Accordingly, the first shielding pattern 30 may be disposed in the same layer as the second gate electrode GE2. Therefore, the first shielding pattern 30 may be formed together with the second gate electrode GE2, and an additional process may not be required to form the first shielding pattern 30.

In an example embodiment, a width of the first signal line 11 may be larger than a width of the second signal line 12 as illustrated in FIG. 3. However, example embodiments according to the invention are not limited thereto. In another example embodiment, for example, a width of the first signal line 11 may be substantially the same as a width of the second signal line 12.

In addition, layers on which the first signal line 11, the second signal line 12 and the first shielding pattern 30 according to the invention are disposed are not limited thereto. In another example embodiment, for example, the first shielding pattern 30 may be disposed on the second insulating layer 130, and may be disposed in the same layer as the gate metal pattern GP. That is, the layer, on which the first shielding pattern 30 is disposed, may be selected between the first and second signal lines 11 and 12.

FIG. 5 is a cross-sectional view taken along line II-II' of FIG. 3. FIG. 6 is a cross-sectional view taken along line III-III' of FIG. 3.

Referring to FIGS. 1, 2, 3, 5, and 6, the display device 1000 may further include a first signal transmission line 21 and the second signal transmission line 22. The first signal transmission line 21 may connect the first signal line 11 to the driving circuit part. In addition, the second signal transmission line 22 may connect the second signal line 12 to the driving circuit part.

In an example embodiment, the first and second signal lines 11 and 12 may transfer the clock signals, respectively, and the driving circuit part may be the gate driver GDV. In an example embodiment, the first and second signal transmission lines 21 and 22 may transfer the clock signals to the gate driver GDV from the first and second signal lines 11 and 12, respectively.

In an example embodiment, the first signal transmission line 21 may be disposed on the second insulating layer 130. Accordingly, the first signal transmission line 21 may be disposed in the same layer as the capacitor electrode pattern GP. The first signal transmission line 21 may contact the first signal line 11 through a first contact part CNT1.

In an example embodiment, the second signal transmission line 22 may be disposed on the first-via-insulating layer 170. Accordingly, the second signal transmission line 22 may be disposed in the same layer as the connecting electrode CE. The second signal transmission line 22 may contact the second signal line 12 through a second contact part CNT2.

In another example embodiment, the second signal transmission line 22 may be disposed on the second insulating layer 130. This will be more fully described with reference to FIG. 9 in the following.

In an example embodiment, the display device 1000 may further include the third signal line 13, the fourth signal line 14, a third signal transmission line 23 and a fourth signal transmission line 24. Structures of the third and fourth signal lines 13 and 14 may be substantially the same as structures of the first and second signal lines 11 and 12, respectively. Structures of the third and fourth signal transmission lines 23 and 24 may be substantially the same as structures of the first and second signal transmission lines 21 and 22. The third and fourth signal transmission lines 23 and 24 may connect the third and fourth signal lines 13 and 14, and the driving circuit part, respectively.

In addition, as shown in FIGS. 4 to 6, the first shielding pattern 30 may be disposed between the first and second signal lines 11 and 12, and may be simultaneously disposed between the third and fourth signal lines 13 and 14.

Figure 7:
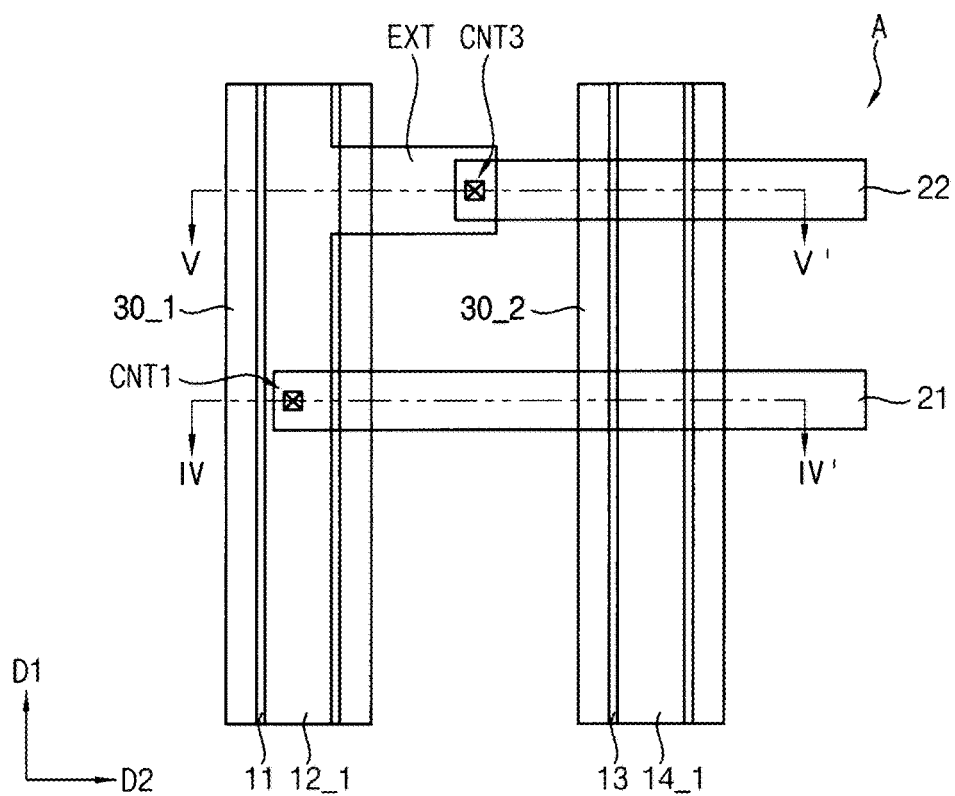
FIG. 7 is an enlarged plan view of area A of FIG. 1 according to another example embodiment.
Figure 8:
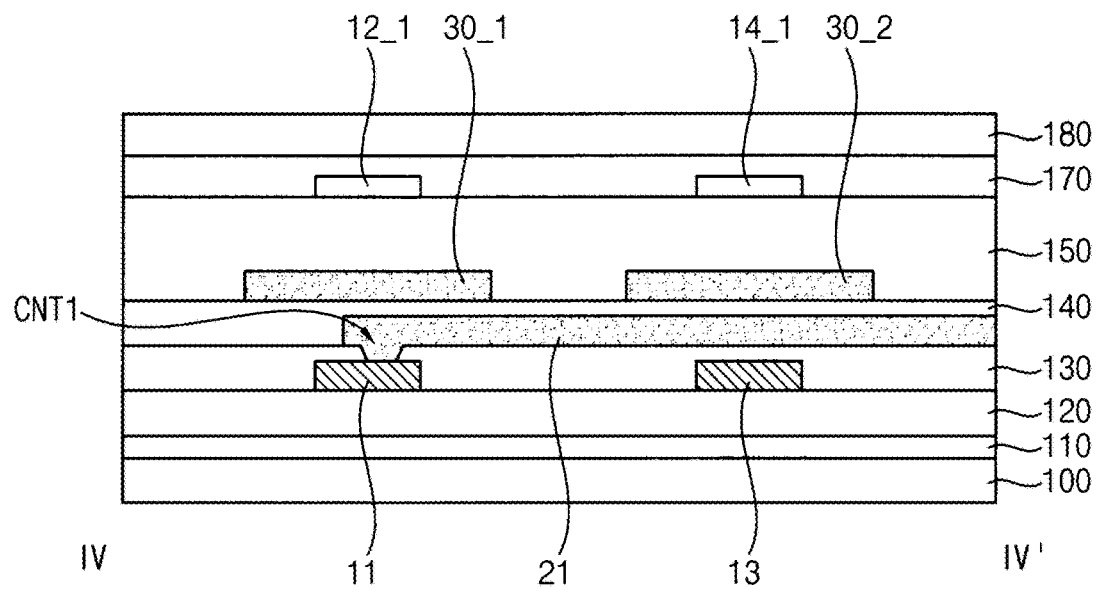
FIG. 8 is a cross-sectional view taken along line IV-IV' of FIG. 7.
Figure 9:
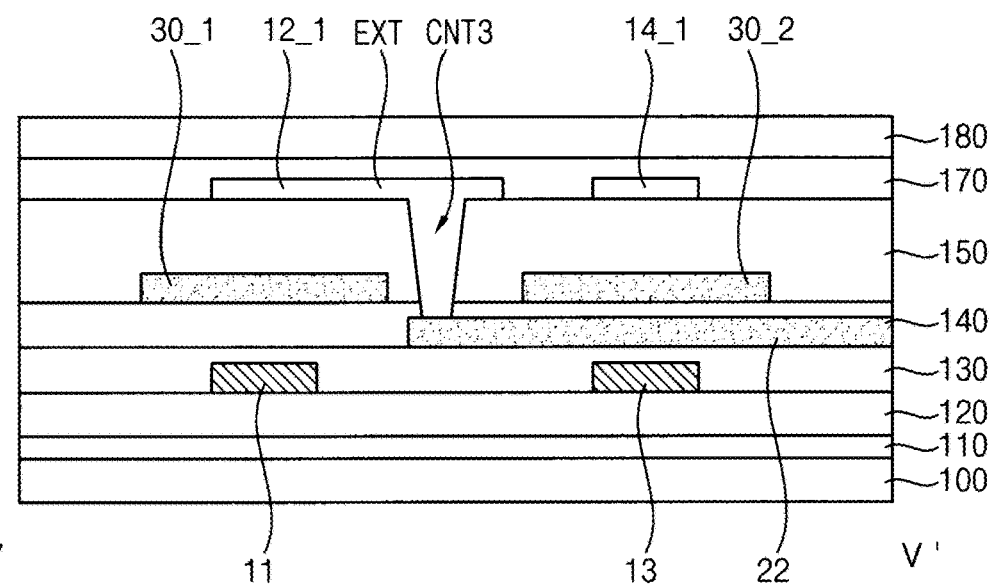
FIG. 9 is a cross-sectional view taken along line V-V' of FIG. 7.

FIG. 7 is an enlarged plan view of area A of FIG. 1 according to another example embodiment. FIG. 8 is a cross-sectional view taken along line IV-IV' of FIG. 7. FIG. 9 is a cross-sectional view taken along line V-V' of FIG. 7.

Referring to FIGS. 1, 2, 7, 8, and 9, a first signal line 11, a third signal line 13, a first signal transmission line 21 and a third signal transmission line 23 may be substantially the same as the first signal line 11, the third signal line 13, the first signal transmission line 21 and the third signal transmission line 23 described with reference to FIGS. 3 to 6, respectively. Accordingly, a second signal line 12_1, a fourth signal line 14_1, a second signal transmission line 22, a fourth signal transmission line 24, a first assistance shielding pattern 30_1, and a second assistance shielding pattern 30_2 will be described below.

The second signal transmission line 22 may be disposed on the second insulating layer 130. Accordingly, the second signal transmission line 22 may be disposed in the same layer as the capacitor electrode pattern GP. In other words, the second signal transmission line 22 may be disposed in the same layer as the first signal transmission line 21, and may extend along the same direction (e.g., the second direction D2) as the first signal transmission line 21. Accordingly, the second signal transmission line 22 may be formed together with the first signal transmission line 21 and the capacitor electrode pattern GP.

In an example embodiment, the second signal line 12_1 may be disposed on the fourth insulating layer 150. Accordingly, the second signal line 12_1 may be disposed in the same layer as the data line pattern. In addition, the second signal line 12_1 may include an extension part EXT overlapping the second signal transmission line 22 in a plan view. The second signal line 12_1 may contact the second signal transmission line 22 through a third contact part CNT3. The third contact part CNT3 may overlap the extension part EXT, and may be spaced apart from the first and second assistance shielding patterns 30_1 and 30_2.

The first assistance shielding pattern 30_1 may be disposed between the first and second signal lines 11 and 12_1. In an example embodiment, the first assistance shielding pattern 30_1 may overlap the first and second signal lines 11 and 12_1. Accordingly, the first assistance shielding pattern 30_1 may extend the same direction (e.g., the first direction D1) as the first and second signal lines 11 and 12. In addition, a width of first assistance shielding pattern 30_1 in the second direction D2 may be greater than a width of the first signal line 11.

In addition, a constant voltage may be provided to the first assistance shielding pattern 30_1. In an example embodiment, the constant voltage may be the high power voltage provided from the high power voltage line 60. In another example embodiment, the constant voltage may be the initialization voltage provided from the initialization voltage line.

In an example embodiment, a structure of the fourth signal line 14_1 may be substantially the same as a structure of the second signal line 12_1. A structure of the fourth signal transmission line 24 may be substantially the same as a structure of the second signal transmission line 22. The fourth signal transmission line 24 may connect the fourth signal line 14_1 to the driving circuit part.

The second assistance shielding pattern 30_2 may be disposed between the third and fourth signal lines 13 and 14_1. In an example embodiment, the second assistance shielding pattern 30_2 may overlap the third and fourth signal lines 13 and 14_1 in a plan view. Accordingly, the second assistance shielding pattern 30_2 may extend along the same direction (e.g., the first direction D1) as the third and fourth signal lines 13 and 14. In addition, a width of the second assistance shielding pattern 30_2 may be greater than a width of the third signal line 13.

In addition, a constant voltage may be provided to the second assistance shielding pattern 30_2. In an example embodiment, the constant voltage may be substantially the same as a constant voltage provided to the first assistance shielding pattern 30_1.

Referring to FIGS. 7 to 9, the second and fourth signal transmission lines 22 and 24 may be disposed on the second insulating layer 130. Accordingly, each of the second and fourth signal lines 12_1 and 14_1 may include the extension part EXT.

Even though, the first and second assistance shielding patterns 30_1 and 30_2 are spaced apart from each other in FIGS. 7 to 9, example embodiments according to the invention are not limited thereto. In another example embodiment, for example, the first and second assistance shielding patterns 30_1 and 30_2 may be connected to each other in a region where the third contact part CNT3 is not formed.

The display devices according to example embodiments described with reference to FIGS. 3 to 6 and 7 to 9 are merely exemplary structures among various structures of the display device. Accordingly, layers on which the lines are disposed, may be variously changed, and those skilled in the art may readily understand.

Figure 10:
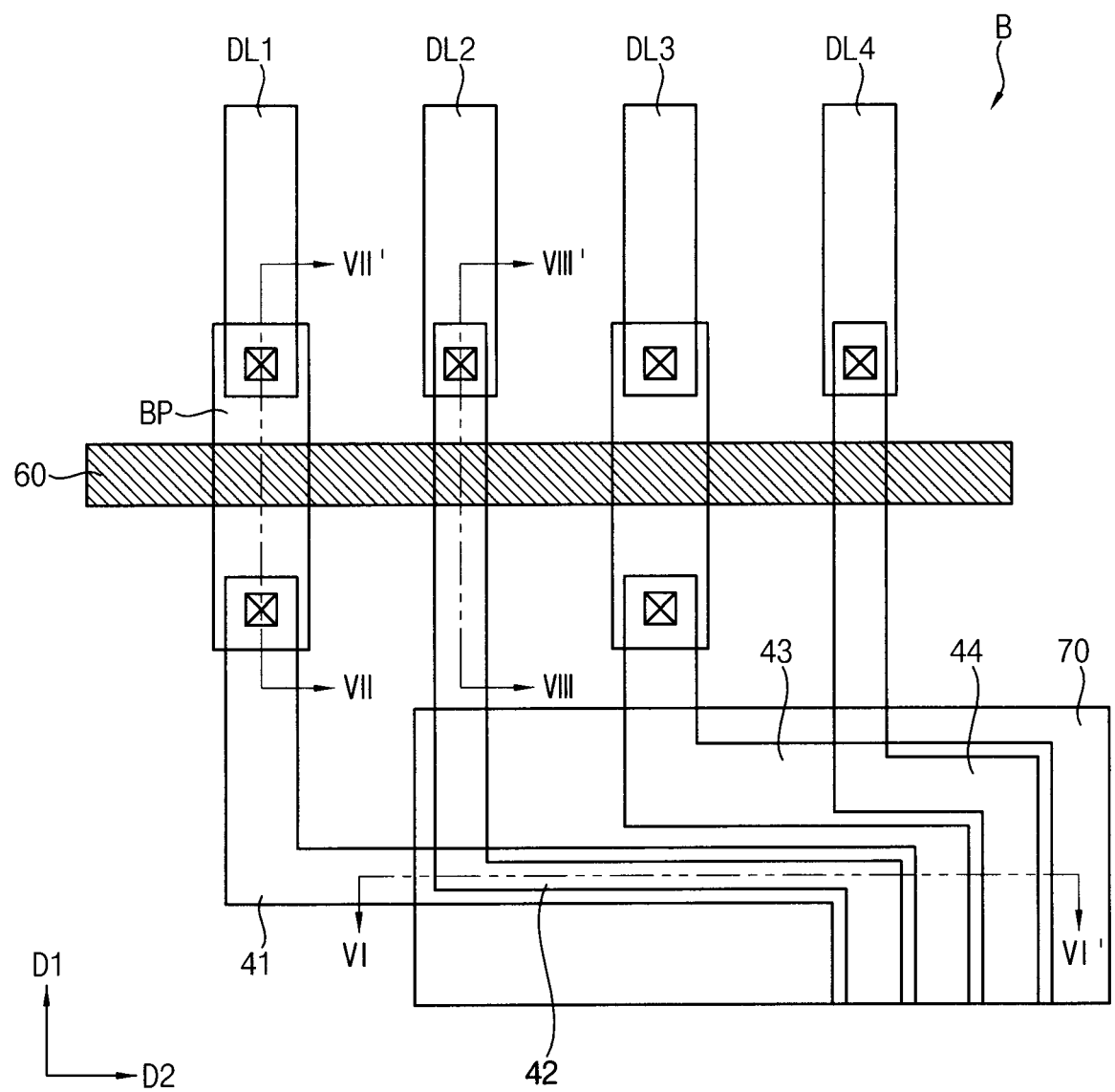
FIG. 10 is an enlarged plan view of area B of FIG. 1 according to an example embodiment.
Figure 11:
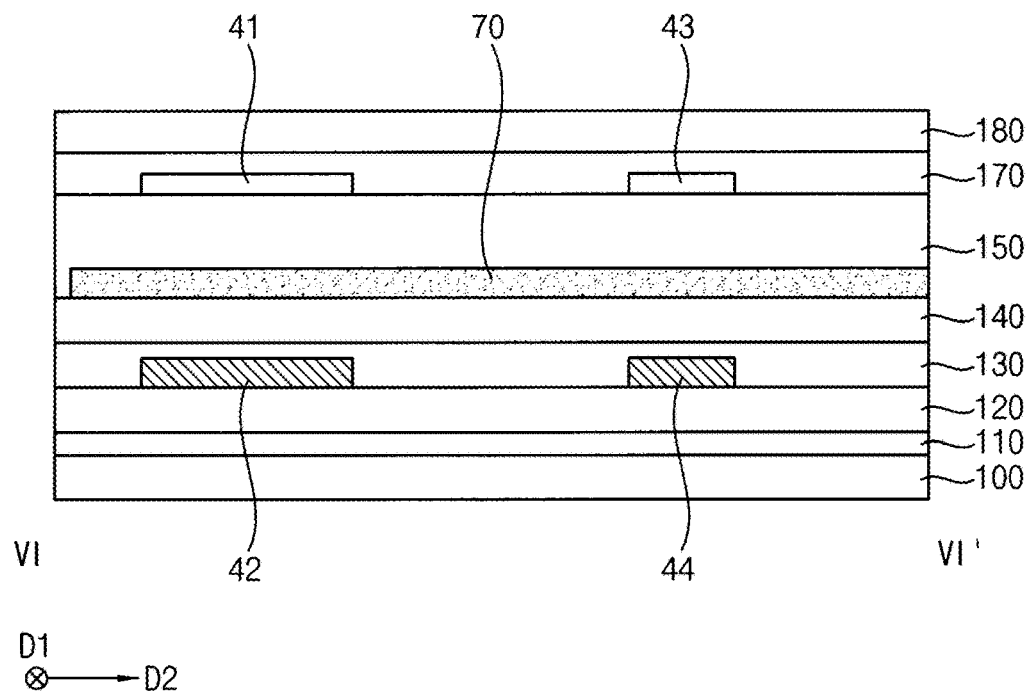
FIG. 11 is a cross-sectional view taken along line VI-VI' of FIG. 10.
Figure 12:
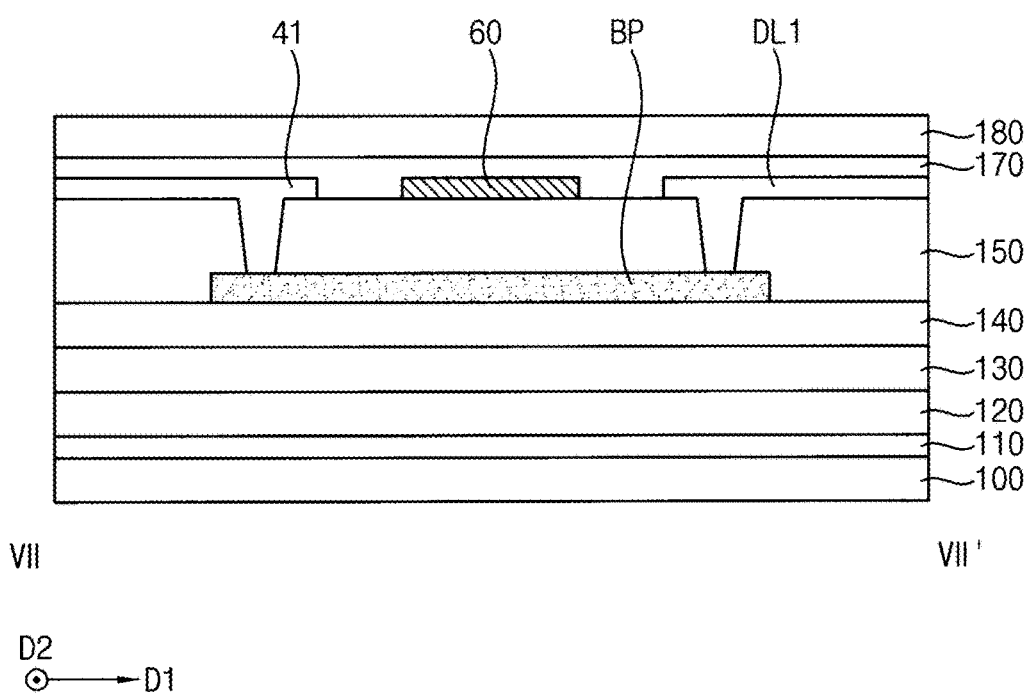
FIG. 12 is a cross-sectional view taken along line VII-VII' of FIG. 10.
Figure 13:
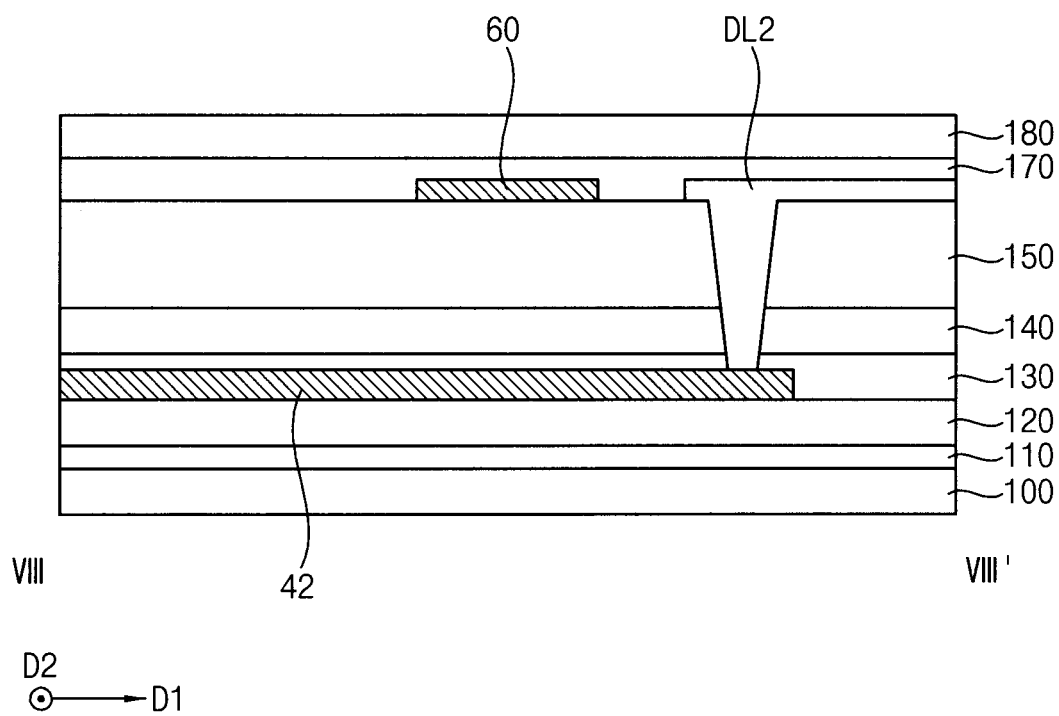
FIG. 13 is a cross-sectional view taken along line VIII-VIII' of FIG. 10.

FIG. 10 is an enlarged plan view of area B of FIG. 1 according to an example embodiment. FIG. 11 is a cross-sectional view taken along line VI-VI' of FIG. 10. FIG. 12 is a cross-sectional view taken along line VII-VII' of FIG. 10. FIG. 13 is a cross-sectional view taken along line VIII-VIII' of FIG. 10.

Referring to FIGS. 1, 10, and 11, the transmission line 40 may include first and second transmission lines 41 and 42.

In an example embodiment, the first transmission line 41 may be disposed on the fourth insulating layer 150. In addition, the second transmission line 42 may be disposed on the first insulating layer 120. For example, the first and second transmission lines 41 and 42 may provide the data voltages to the first and second data lines DL1 and DL2, respectively.

The first and second transmission lines 41 and 42 may overlap each other in a plan view. As the first and second transmission lines 41 and 42 overlap each other, a width of the peripheral area PA (e.g. a width along the first direction D1) may be reduced, or a space, in which an additional line may be disposed in the peripheral area PA, may be further secured.

The second shielding pattern 70 may be disposed between the first and second transmission lines 41 and 42. For example, the second shielding pattern 70 may be disposed on the third insulating layer 140 and may overlap the first and second transmission lines 41 and 42. As a constant voltage is provided to the second shielding pattern 70, the second shielding pattern 70 may prevent a coupling effect between the first and second transmission lines 41 and 42.

Referring to FIGS. 1, 10, and 12, the display device 1000 may further include a bridge pattern BP such that the first transmission line 41 may bypass the high power voltage line 60 to be connected to the first data line DL1. In an example embodiment, the bridge pattern BP may be disposed on the third insulating layer 140.

Referring to FIGS. 1, 10, and 13, the second transmission line 42 may be connected to the second data line DL2 by extending under the high power voltage line 60 without any additional bridge pattern.

In an example embodiment, the transmission line 40 may further include third and fourth transmission lines 43 and 44.

In an example embodiment, the third transmission line 43 may be disposed on the fourth insulating layer 150. In addition, the fourth transmission line 44 may be disposed on the first insulating layer 120. For example, the third and fourth transmission lines 43 and 44 may provide the data voltages to the third and fourth data lines DL3 and DL4, respectively.

The second shielding pattern 70 may be disposed between the third and fourth transmission lines 43 and 44. Thus, the second shielding pattern 70 may be disposed between the first and second transmission lines 41 and 42 and may be simultaneously disposed between the third and fourth transmission lines 43 and 44.

As the signal lines and/or the transmission lines, disposed in the peripheral area PA of the display device 1000 according to example embodiments, overlap each other, a width of the peripheral area PA may be reduced or a space, in which an additional line may be disposed in the peripheral area PA, may be further secured. At the same time, since the display device 1000 includes the shielding pattern (e.g., the first shielding pattern 30 or the second shielding pattern 70) disposed between the lines overlapping each other, the occurrence of the coupling effect between the lines may be prevented.

The present inventive concept may be applied to a display device and an electronic device using the display device. For example, the present inventive concept may be applied to a cellular phone, a smart phone, a video phone, a smart pad, a smart watch, a tablet PC, a car navigation system, a television, a computer monitor, a laptop, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
   a pixel structure disposed in a display area;
   a first signal line disposed in a peripheral area adjacent to the display area;
   a second signal line which overlaps the first signal line in a plan view and extends in a same direction as the first signal line;
   a driving circuit part disposed in the peripheral area and electrically connected to the first signal line and the second signal line; and
   a first shielding pattern disposed between the first signal line and the second signal line,
   wherein the first shielding pattern is formed of a conductive material, and
   wherein the first shielding pattern is spaced apart from the first signal line and the second signal line.

2. The display device of claim 1, wherein a constant voltage is provided to the first shielding pattern.

3. The display device of claim 2, wherein the constant voltage is a high power voltage.

4. The display device of claim 2, wherein the constant voltage is an initialization voltage.

5. The display device of claim 1, wherein a width of the first shielding pattern is greater than a width of the first signal line, and is greater than a width of the second signal line.

6. The display device of claim 1, further comprising:
   a first signal transmission line disposed between the first shielding pattern and the first signal line, and which electrically connects the first signal line to the driving circuit part.

7. The display device of claim 6, further comprising:
   a second signal transmission line disposed on the second signal line, and which electrically connects the second signal line to the driving circuit part.

8. The display device of claim 7, wherein the pixel structure includes:
   a first active pattern;
   a first gate electrode disposed on the first active pattern;
   a capacitor electrode pattern disposed on the first gate electrode;
   a second active pattern disposed on the capacitor electrode pattern;
   a second gate electrode disposed on the second active pattern;
   a data line pattern disposed on the second gate electrode; and
   a connecting electrode disposed on the data line pattern,
   wherein the first shielding pattern is disposed in a same layer as the second gate electrode,
   wherein the first signal line is disposed in a same layer as the first gate electrode, and
   wherein the second signal line is disposed in a same layer as the data line pattern.

9. The display device of claim 8, wherein the first signal transmission line is disposed in a same layer as the capacitor electrode pattern, and
   wherein the second signal transmission line is disposed in a same layer as the connecting electrode.

10. The display device of claim 8, wherein the first and second signal transmission lines are disposed in a same layer as the capacitor electrode pattern.

11. The display device of claim 10, wherein the second signal line includes an extension part overlapping the second signal transmission line in the plan view,
   wherein the extension part is connected to the second signal transmission line through a contact part, and
   wherein the contact part is spaced apart from the first shielding pattern.

12. The display device of claim 8, wherein the first active pattern includes a silicon semiconductor, and
   wherein the second active pattern includes an oxide semiconductor.

13. The display device of claim 1, further comprising:
   a third signal line disposed in the peripheral area; and
   a fourth signal line which overlaps the third signal line and extends in a same direction as the third signal line,
   wherein the first shielding pattern is further disposed between the third signal line and the fourth signal line, and
   wherein the driving circuit part is electrically connected to the first to fourth signal lines.

14. The display device of claim 13, wherein the first shielding pattern includes a first assistance shielding pattern and a second assistance shielding pattern,
   wherein the first assistance shielding pattern is disposed between the first signal line and the second signal line,
   wherein the second assistance shielding pattern is disposed between the third signal line and the fourth signal line, and
   wherein the first and second assistance shielding patterns are spaced apart from each other.

15. The display device of claim 1, further comprising:
   a plurality of data lines disposed in the display area;
   a first transmission line disposed in the peripheral area and electrically connected to a first data line of the plurality of data lines;
   a second transmission line which overlaps the first transmission line in the plan view and is electrically connected to a second data line of the plurality of data lines; and
   a second shielding pattern disposed between the first transmission line and the second transmission line,
   wherein a constant voltage is provided to the second shielding pattern.

16. A display device, comprising:
   a pixel structure disposed in a display area;
   a plurality of data lines disposed in the display area;
   a first transmission line disposed in a peripheral area adjacent to the display area and electrically connected to a first data line of the plurality of data lines;
   a second transmission line which overlaps the first transmission line in a plan view and is electrically connected to a second data line of the plurality of data lines; and
   a shielding pattern disposed between the first transmission line and the second transmission line,
   wherein a constant voltage is provided to the shielding pattern,
   wherein the shielding pattern is formed of a conductive material,
   wherein the shielding pattern is spaced apart from the first transmission line and the second transmission line, and
   wherein a same voltage is applied to the second transmission line and the second data line.

17. The display device of claim 16, wherein the constant voltage is a high power voltage.

18. The display device of claim 16, wherein the constant voltage is an initialization voltage.

19. The display device of claim 16, wherein the pixel structure includes:
   a first active pattern;
   a first gate electrode disposed on the first active pattern;
   a capacitor electrode pattern disposed on the first gate electrode;
   a second active pattern disposed on the capacitor electrode pattern;
   a second gate electrode disposed on the second active pattern;
   a data line pattern disposed on the second gate electrode; and
   a connecting electrode disposed on the data line pattern,
   wherein the shielding pattern is disposed in a same layer as the second gate electrode,
   wherein the first transmission line is disposed in a same layer as the first gate electrode, and
   wherein the second transmission line is disposed in a same layer as the data line pattern.

20. The display device of claim 16, further comprising:
   a third transmission line disposed in the peripheral area and electrically connected to a third data line of the plurality of data lines; and
   a fourth transmission line which overlaps the third transmission line in the plan view and is electrically connected to a fourth data line of the plurality of data lines,
   wherein the shielding pattern is further disposed between the third transmission line and the fourth transmission line.

* * * * *